(12) United States Patent
Porat et al.

(10) Patent No.: US 7,165,196 B1
(45) Date of Patent: Jan. 16, 2007

(54) METHOD FOR TESTING SERIALIZERS/DE-SERIALIZERS

(75) Inventors: Ofer Porat, Westborough, MA (US); Jinhua Chen, Shrewsbury, MA (US); Marlon Ramroopsingh, Attleboro, MA (US); Alexander Rabinovich, Acton, MA (US)

(73) Assignee: EMC Corporation, Hopkinton, MA (US)

( * ) Notice: Subject to any disclaimer, the term of this patent is extended or adjusted under 35 U.S.C. 154(b) by 263 days.

(21) Appl. No.: 10/934,874

(22) Filed: Sep. 3, 2004

(51) Int. Cl.
*G01R 31/28* (2006.01)
(52) U.S. Cl. .................................. 714/716; 714/724
(58) Field of Classification Search ............... 714/724, 714/733, 715, 716
See application file for complete search history.

(56) References Cited

U.S. PATENT DOCUMENTS 6,892,337 B1 * 5/2005 Brophy et al. ............. 714/739

* cited by examiner

Primary Examiner—James C Kerveros

(57) ABSTRACT

A test system and method for testing a serializer/de-serializer system. The system includes a pair of serializer/de-serializers each having a serial data receive port and a serial data transmit port. The serializer/de-serializers are adapted to be placed in a loop-back mode in response to a loop-back signal to pass data fed to the serial data receive port to the serial data transmit port. A backplane connects the serial data transmit port of one serializer/de-serializer to the serial data receive port of a second one of the serializer/de-serializers. A tester passes data to the first serial data receive port and receives data from the data transmit port of the second one of the serializer/de-serializers with both serializer/de-serializes placed in the loop-back mode.

15 Claims, 3 Drawing Sheets

METHOD FOR TESTING SERIALIZERS/DE-SERIALIZERS

TECHNICAL FIELD

This invention relates generally to serializers/de-serializers (SERDES) and more particularly to methods for testing SERDES.

BACKGROUND

As is known in the art, serializers/de-serializers (SERDES) are used in many systems for transferring data from a source on one printed circuit board to a destination on a second printed circuit board, where the two boards are plugged into a common backplane.

More particularly, the source produces the data as parallel data. The parallel data is converted by a SERDES into serial data. The serial data is transmitted to the backplane where it passes as serial data to a second SERDES for the destination. The second SERDES converts the serial data into parallel data for the destination of the second printed circuit board.

As is also known in the art, it is desirable to test the system, including the integrity of the serial data, i.e., in effect analog type pulses, produced by the SERDES prior to proceeding with commercial production. Further, it is desirable to test the effect of the designer's backplane on such analog signals.

Further, while multiple vendors offer SERDES, it is important to establish a testing method that will be independent of the vendors. More particularly, SERDES testing was generally limited to testing the quality of the analog signal; i.e., the quality of serial data. There was no external bit error rate testing using the system designer's signal test pattern, and the system designer typically was required to rely on the vendor's pattern generator. If the designer wanted to test its pattern, the designer had to design a complete chip with the SERDES thereby requiring undesirable time loss and resource consumption. If the designer wanted to test system interoperability, the designer typically was required to design two chips; an impractical situation.

SUMMARY

In accordance with the present invention, a test system is provided for testing a serializer/de-serializer system. The test system includes a first serializer/de-serializer having a first serial data receive port and a first serial data transmit port. The first serializer/deserializer is adapted to be placed in a loop-back mode in response to a loop-back signal fed to such first serializer/de-serializer to pass data fed to the first serial data receive port to the first serial data transmit port. A second serializer/de-serializer is provided having a second serial data receive port and second serial data transmit port. The second serializer/deserializer is adapted to be placed in a loop-back mode in response to a loop-back signal fed to such second serializer/de-serializer to pass data fed to the second serial data receive port to the second serial data transmit port. The first serial data transmit port is connected to the second serial data receive port. A tester feeds data to the first serial data receive port and for receiving data from the second serial data transmit port with both such first and second serializers/de-serializers placed in the loop-back mode.

In one embodiment, the first serializer/de-serializer and the second serializer/de-serializer are on a common integrated circuit chip.

In one embodiment, the first serializer/de-serializer and the second serializer/de-serializer are on a different integrated circuit chips.

In one embodiment, the first serializer/de-serializer and the second serializer/de-serializer are manufactured by different vendors.

In accordance with another feature of the invention, a test system is provided for testing a serializer/de-serializer system. The test system includes a first serializer/de-serializer having a first serial data receive port and a first serial data transmit port plugged into a backplane. The first serializer/deserializer is adapted to be placed in a loop-back mode in response to a loop-back signal fed to such first serializer/de-serializer to pass data fed to the first serial data receive port, through a first data receive deserializer circuit of the first serializer/de-serializer, to parallel data ports thereof, then to a first serializer circuit of the first serializer/de-serializer, and then to the first serial data transmit port thereof. A second serializer/de-serializer is provided having a second serial data receive port and a second serial data transmit port plugged into the backplane. The second serializer/deserializer is adapted to be placed in a loop-back mode in response to a loop-back signal fed to such second serializer/de-serializer to pass data fed to the second serial data receive port, through a second data receive deserializer circuit and a parallel port thereof to a second serializer circuit of the second serializer/de-serializer to the second serial data transmit port thereof. The backplane connects the first serial data transmit port to the second serial data receive port. A tester feeds serial data into the first serial data receive port. The data passes from the first serial receive data port to the first serial data transmit port when such first serializer/de-serializers is placed in the loop-back mode. The data passes from the first serial transmit port through the backplane into the second serial data receive port. The data passes from the second serial receive data port to the second transmit serial data port when such second serializer/de-serializers is placed in the loop-back mode. The data passes from the second serial data transmit port to the tester.

In one embodiment, the first serializer/de-serializer and the second serializer/de-serializer are on a common integrated circuit chip.

In one embodiment, the first serializer/de-serializer and the second serializer/de-serializer are on a different integrated circuit chips.

In one embodiment, the first serializer/de-serializer and the second serializer/de-serializer are manufactured by different vendors.

In one embodiment, the tester is a bit stream rate error tester.

In accordance with still another feature of the invention, a method is provided for testing a serializer/de-serializer system having: a first serializer/de-serializer having a first serial data receive port and a first serial data transmit port, such serializer/deserializer being adapted to be placed in a loop-back mode in response to a loop-back signal fed to such serializer/de-serializer to pass data fed to the first serial data receive port to the first serial data transmit port; a second serializer/de-serializer having a second serial data receive port and second serial data transmit port, second serializer/de-serializer being adapted to be placed in a loop-back mode in response to a loop-back signal fed to such second serializer/de-serializer to pass data fed to the second serial data receive port to the second serial data transmit port; and a backplane for connecting the first serial data transmit port to the second serial data receive port. The method include passing a known pattern of serial data to the first serial data receive port. The data passes from the first serial receive data port to the first serial data transmit port with such first serializer/de-serializer placed in the loop-back mode. The data passes from the first serial transmit port through the backplane into the second serial data receive port of the second serializer/de-serializer. The data passes from the second serial receive data port to the second transmit serial data port with such second serializer/de-serializer placed in the loop-back mode. The method compares the data passing from the second serial data transmit port with to the known data pattern sent to the first serial data receive port.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
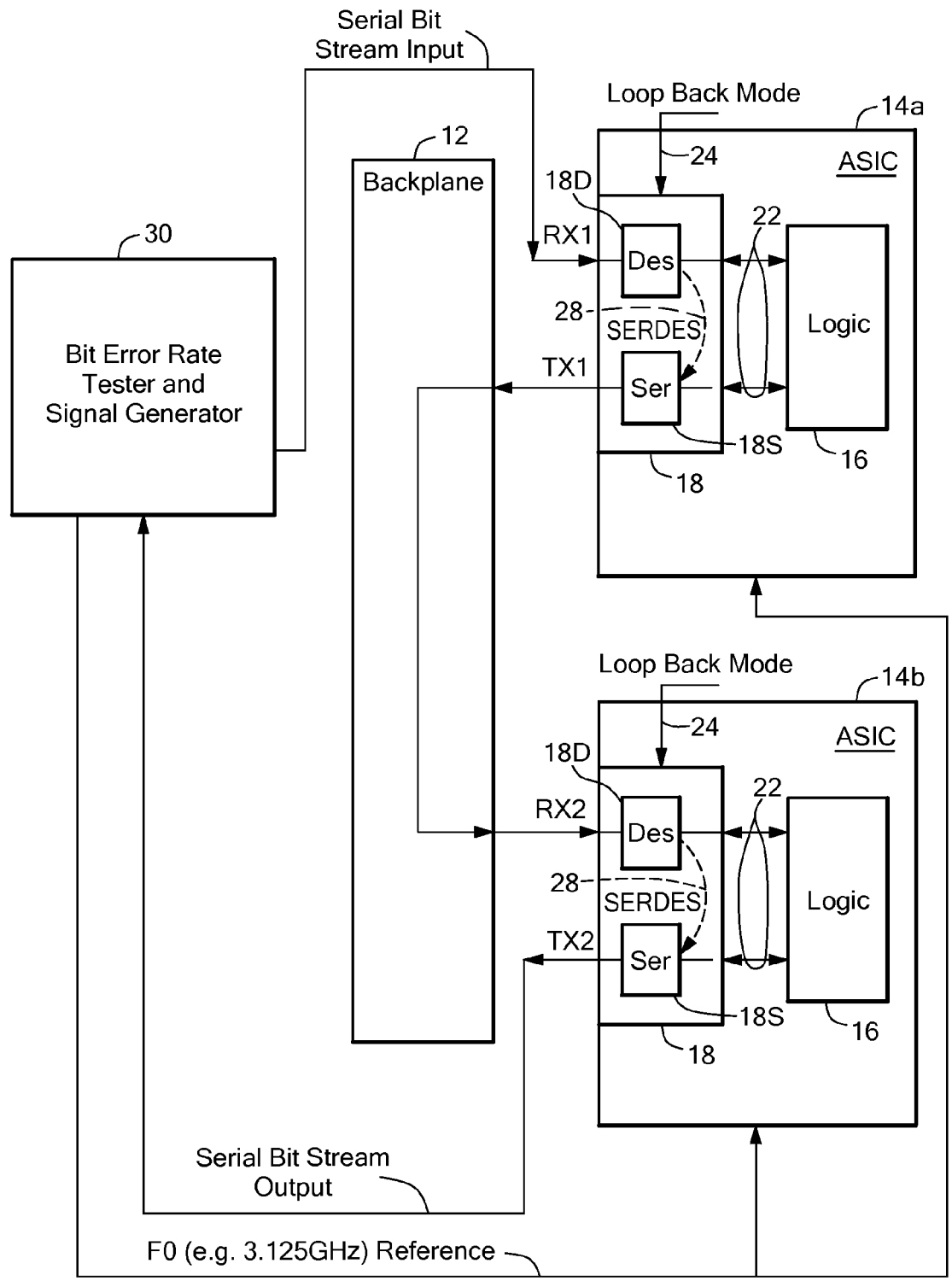
FIG. 1A is a block diagram on a test system for testing a pair of SERDES manufactured by different vendors, each one on a different integrated circuit chip according to the invention.

Referring now to FIG. 1A, a test system 10 is shown for testing a serializer/de-serializer (SERDES) system. The test system 10 includes a backplane 12 and a plurality of, here a pair of integrated circuits, here Application Specific Integrated Circuits (ASICs) 14a, 14b. Each one of such ASICs 14a, 14b includes: a logic section 16 and a serializer/de-serializer 18 connected to the logic section 16. Here, each one of the ASICs 14a, 14b is manufactured by a different vendor. Each serializer/de-serializer 18 has a serial data receive port RX coupled to a de-serializer circuit 18D of the serializer/de-serializer 18 and a serial data transmit port TX coupled to a serializer circuit 18S of the serializer/de-serializer 18 plugged into the backplane 12 and a pair of parallel data ports 22; one for transmitting parallel data to a logic 16 and one for receiving parallel data from logic 16. Here, the serial data receive port of the serializer/de-serializer 18 on ASIC 14a is designated as RX1 and the serial data transmit port of the serializer/de-serializer 18 on ASIC 14a is designated as TX1. Likewise, the serial data receive port of the serializer/de-serializer 18 on ASIC 14b is designated as RX2 and the serial data transmit port of the serializer/de-serializer 18 on ASIC 14b is designated as TX2. The logic section 16 serves for two purposes: on the transmit side it generates a vendor specific data pattern and send it through a parallel bus to the SERDES; on the receive side it checks the integrity of the data pattern by comparing the serial data at TX2 with a vendor specific data pattern. As known, a SERDES as an entity having a serial interface, serial input/output buffer, an analog serial/parallel converter with a clock recovery circuit and a parallel interface. In accordance with the invention, the process checks the SERDES independent of the logic of the vendor. That is, the process in accordance with the invention, tests entire SERDES entity functionality, including the serial to parallel conversion. When the SERDES is placed in a loop back mode, a serial signal received on RX is de-serialized to a parallel bus of the RX section of the SERDES, then instead of going into a vendor logic block, the RX parallel bus goes directly to the parallel bus of the TX section of the SERDES where such data on the parallel bus of the TX it is then serialized. The serialized data is then transmitted externally of the SERDES on TX.

It is noted that because the serializer/de-serializer 18 and logic 16 are formed as a single integrated circuit (ASIC) chip 14a, 14b, the parallel data ports 22 are not readily accessible for externally testing the signals produced on such parallel data ports 22.

Each such serializer/de-serializer 18 is adapted to be placed in a loop-back mode in response to a loop-back signal fed to such serializer/de-serializer on line 24. When in the loop-back mode, data fed to the serial data receive port RX passes to the serial data transmit port TX, through the parallel ports) as indicted by the dotted arrow 28.

A tester 30, here a bit error rate tester, is provided to feed serial data into the serial data receive port RX1 of the serializer/de-serializer 18 on ASIC 14a. The system designer selects the test pattern. The data passes from the serial transmit data port RX1 of such serializer/de-serializers 18 on ASIC 14a to the serial data transmit port TX1 of such serializer/de-serializers 18 on ASIC 14a (i.e., through the de-serializer 18D of RX1, the parallel ports, and the serializer 18S of TX1) when such serializer/de-serializers is placed in the loop-back mode. The data then passes from the serial transmit port TX1 through the backplane 12 into the serial data receive port RX2 of the serializer/de-serializer 18 on ASIC 14b. The data then passes from the serial receive data port RX2 of the serializer/de-serializers 18 on ASIC 14b to the transmit serial data port TX2 of the serializer/de-serializer 18 on ASIC 14b(i.e., through the de-serializer 18D of RX1, the parallel ports, and the serializer 18S of TX1) when such serializer/de-serializer 18 on ASIC 14b is placed in the loop-back mode. The data then passes from the serial data transmit port TX2 of the serializer/de-serializer 18 on ASIC 14b to the tester 30. The other purpose of the tester is to provide the reference clock to the ASICs, having the frequency, F0, of the serial bit stream.

Thus, with such system a method is provided for testing the serializer/de-serializers 18. As noted above, each one of the serializer/de-serializers 18 has the serial data receive port and a serial data transmit port plugged into the backplane 12. Each serializer/de-serializer 18 is adapted to be placed in a loop-back mode in response to a loop-back signal fed to such serializer/de-serializer 18 to thereby pass data fed to the serial data receive port RX to the serial data transmit port TX (i.e., through the de-serializer 18D of RX1, the parallel ports, and the serializer 18S of TX1) The method includes passing a known pattern of serial data from tester 30 to the serial data receive port RX1 of a first one of a plurality of a serializer/de-serializers 18. The data passes from the serial receive data port RX1 of such first one of the serializer/de-serializers to the serial data transmit port TX1 of such first one of the serializer/de-serializers 18 when such first one of the serializer/de-serializers is placed in the loop-back mode. The data passes from the serial transmit port TX1 of the first one of the serializer/de-serializer 18 through the backplane 12 into the serial data receive port RX2 of a second one of the serializer/de-serializers 18. The data passes from the serial receive data port RX2 of such second one of the serializer/de-serializers to the transmit serial data port TX2 of the second one of the serializer/de-serializers 18 when such second one of the serializer/de-serializers is placed in the loop-back mode. The method includes comparing the data passing from the serial data transmit port TX2 of the second one of the serializer/de-serializer 18 with the known pattern of serial data passed by the tester 30 to the serial data receive port RX1 of a first one of a plurality of a serializer/de-serializers 18, (i.e., through the de-serializer 18D of RX1, the parallel ports, and the serializer 18S of TX1

Figure 1B:
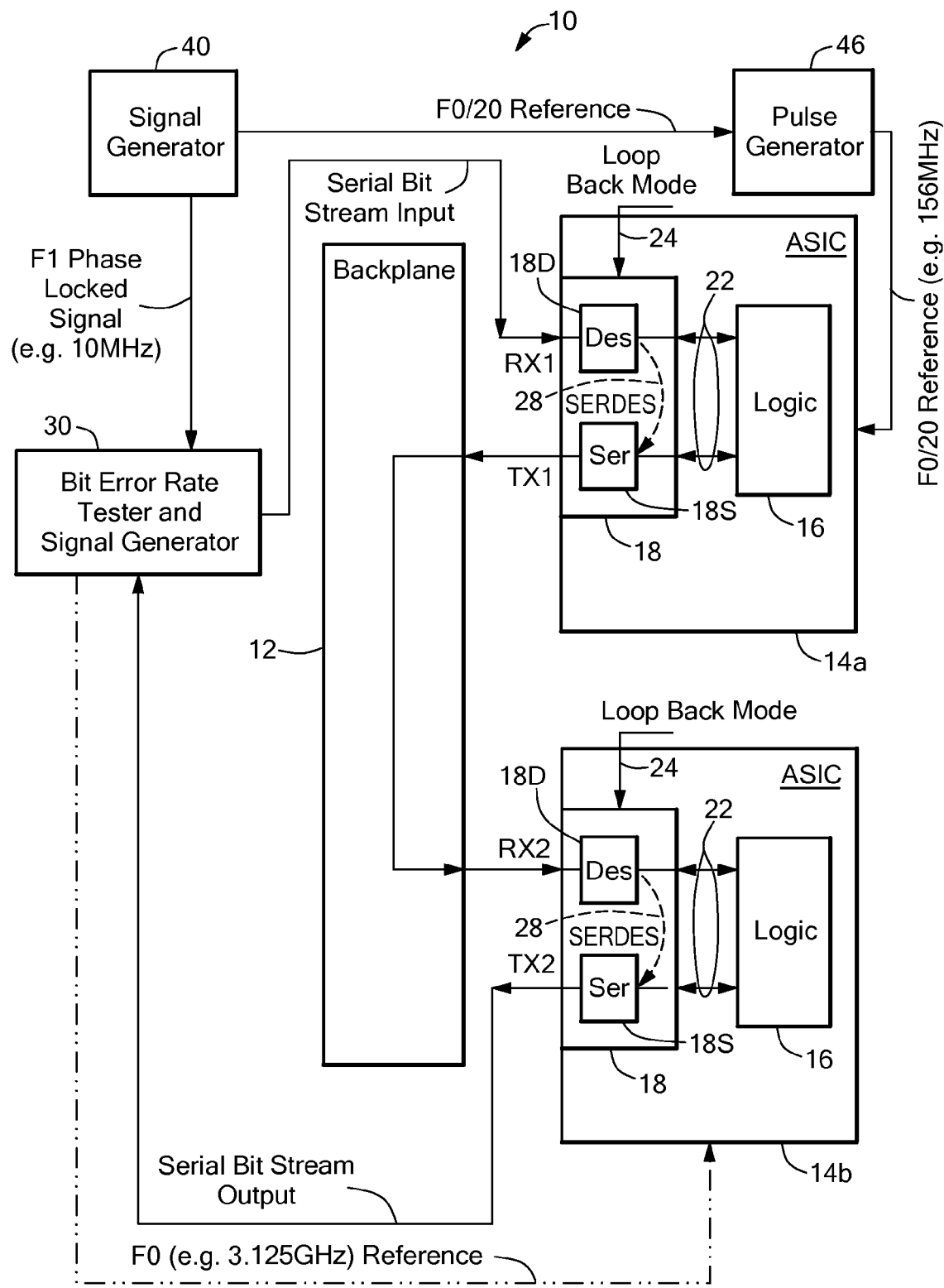
FIG. 1B is a block diagram on a test system for testing a pair of SERDES manufactured by different vendors according to an alternate embodiment of the invention.

Referring now to FIG. 1B, an arrangement is shown for use where one of the ASICs, here ASIC 14a will not operate with the frequency F0 of the serial bit stream as a reference clock, but rather only with a frequency equal to the parallel data stream, which is a fraction of the serial bit stream frequency (e.g. F0/20). To solve this problem, an additional signal generator 40 is provided. Signal generator 40 provides the F0/20 reference frequency to here ASIC 14a, while the tester and signal generator 30 generates the F0 reference frequency to the other ASIC, here ASIC 14b. The signal generator 40 also provides an additional reference frequency F1 (e.g. 10 MHz), to the tester and signal generator 30, which uses this frequency to align the signal edges of F0 to the signal edges of F0/20 of signal generator 40 for the purpose of reliable equipment operation.

Figure 2:
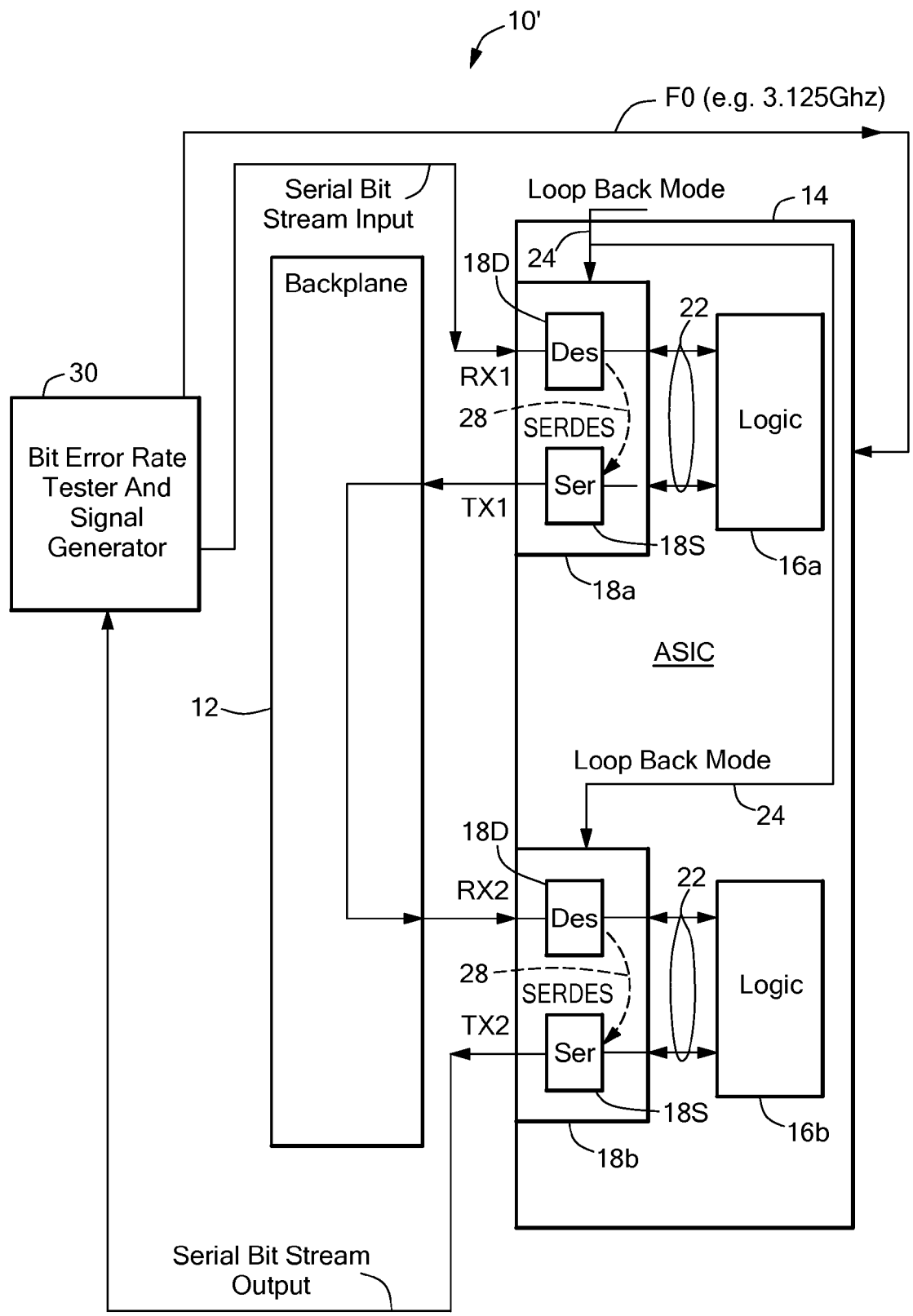
FIG. 2 is a block diagram on a test system for testing a pair of SERDES on a common integrated circuit chip according to the invention The details of one or more embodiments of the invention are set forth in the accompanying drawings and the description below. Other features, objects, and advantages of the invention will be apparent from the description and drawings, and from the claims.

It should be noted that in some systems the F0, or F0/20 signals may be single ended, while the ASIC(s) input reference clock(s) may be differential. Thus, referring to FIG. 1B, here the ASIC 14a is such an ASIC. Thus, a pulse generator 46 is included to convert such the single ended F0/20 signal to differential F0/20 signal for ASIC 14a Referring now to FIG. 2, a test system 10' is shown for testing a serializer/de-serializer (SERDES) system. The test system 10' includes a backplane 12 and a single ASIC 14. The ASIC 14 includes a pair of SERDES 18a, 18b, each one connected to a corresponding one of a pair of logics 16a, 16b, as shown. Each serializer/de-serializer 18a, 18b has a serial data receive port (RX) and a serial data transmit port TX plugged into the backplane 12 and a parallel data port 22 connected to the connected logic 16a, 16b, respectively, as shown. Here, the serial data receive port of the serializer/de-serializer 18a is designated as RX1 and the serial data transmit port of the serializer/de-serializer 18a is designated as TX1. Likewise, the serial data receive port of the serializer/de-serializer 18b is designated as RX2 and the serial data transmit port of the serializer/de-serializer 18b is designated as TX2. It is noted that because the serializer/de-serializer 18a, 18b and logic 16a, 16b are formed as a single integrated circuit (ASIC) chip 14 the parallel data ports 22 are not readily accessible for externally testing the signals produced on such parallel data ports 22.

Each such serializer/de-serializer 18a, 18b is adapted to be placed in a loop-back mode in response to a loop-back signal fed to such serializer/de-serializer on line 24. When in the loop-back mode, data fed to the serial data receive port RX passes to the serial data transmit port TX as indicted by the dotted arrow 28.

A tester 30, here a bit error rate tester, is provided to feed serial data into the serial data receive port RX1 of the serializer/de-serializer 18a. The system designer selects the test pattern. The data passes from the serial transmit data port RX1 of such serializer/de-serializers 18a to the serial data transmit port TX1 of such serializer/de-serializers 18a when such serializer/de-serializers is placed in the loop-back mode. The data then passes from the serial transmit port TX1 through the backplane 12 into the serial data receive port RX2 of the serializer/de-serializer 18b (i.e., through the de-serializer 18D of RX1, the parallel ports, and the serializer 18S of TX1). The data then passes from the serial receive data port RX2 of the serializer/de-serializers 18b to the transmit serial data port TX2 of the serializer/de-serializer 18b when such serializer/de-serializer 18b is placed in the loop-back mode. The data then passes from the serial data transmit port TX2 of the serializer/de-serializer 18b to the tester 30.

Thus, with such system a method is provided for testing the serializer/de-serializers 18a, 18b. As noted above, each one of the serializer/de-serializers 18a, 18b has the serial data receive port and a serial data transmit port plugged into the backplane 12. Each serializer/de-serializer 18a, 18b is adapted to be placed in a loop-back mode in response to a loop-back signal fed to such serializer/de-serializer 18a, 18b to thereby pass data fed to the serial data receive port RX to the serial data transmit port TX. The method includes passing a known pattern of serial data from tester 30 to the serial data receive port RX1 of a first one of a plurality of a serializer/de-serializers 18a. The data passes from the serial receive data port RX1 of such first one of the serializer/de-serializers 18a to the serial data transmit port TX1 of such first one of the serializer/de-serializers 18a when such first one of the serializer/de-serializers 18a is placed in the loop-back mode. The data passes from the serial transmit port TX1 of the first one of the serializer/de-serializer 18a through the backplane 12 into the serial data receive port RX2 of a second one of the serializer/de-serializers 18b. The data passes from the serial receive data port RX2 of such second one of the serializer/de-serializers 18b to the transmit serial data port TX2 of the second one of the serializer/de-serializers 18b when such second one of the serializer/de-serializers 18b is placed in the loop-back mode. The method includes comparing the data passing from the serial data transmit port TX2 of the second one of the serializer/de-serializer 18b with the known pattern of serial data passed by the tester 30 to the serial data receive port RX1 of a first one of a plurality of a serializer/de-serializers 18a.

A number of embodiments of the invention have been described. Nevertheless, it will be understood that various modifications may be made without departing from the spirit and scope of the invention. Accordingly, other embodiments are within the scope of the following claims.

What is claimed is:

1. A test system for testing a serializer/de-serializer system, the system comprising:
 a first serializer/de-serializer having a first serial data receive port and a first serial data transmit port the first serializer/de-serializer being placed in a loop-back mode in response to a loop-back signal fed to the first serializer/de-serializer to pass data fed to the first serial data receive port to the first serial data transmit port;
 a second serializer/de-serializer having a second serial data receive port and second serial data transmit port second serializer/de-serializer being placed in a loop-back mode in response to a loop-back signal fed to the second serializer/de-serializer to pass data fed to the second serial data receive port to the second serial data transmit port, the first serial data transmit port being connected to the second serial data receive port;
 a tester for feeding data to the first serial data receive port and for receiving data from the second serial data transmit port with both such the first and second serializers/de-serializers placed in the loop-back mode; and wherein the first serializer/de-serializer and the second serializer/de-serializer are on different integrated circuit chips.

2. The system recited in claim 1 wherein the first serializer/de-serializer and the second serializer/de-serializer are manufactured by different vendors.

3. The system recited in claim 2 wherein the tester is a bit error rate tester.

4. The system recited in claim 1 wherein the tester is a bit error rate tester.

5. The test system recited in claim 1 including a source of first reference clock signals for the first serializer/de-serializer and second reference clock signals for the second serializer/de-serializer, the first reference clock signals having a frequency different from the second reference clock signals.

6. The system recited in claim 5 wherein the tester is bit error rate tester and wherein the source comprises a signal generator for producing one of the first and second clock reference signals and a phase locked signal for the bit error rate tester and wherein the bit error rate tester produces the other one of the first and second clock reference signal.

7. A test system for testing a serializer/de-serializer system, comprising:
a backplane:
a first serializer/de-serializer having a first serial data receive port and a first serial data transmit port plugged into the backplane;
a first logic section connected to parallel data ports of the first serializer/de-serializer;
wherein the first serializer/de-serializer is placed in a loop-back mode in response to a loop-back signal fed to the first serializer/de-serializer to pass data fed to the first serial data receive port thereof to the first serial data transmit port thereof;
a second serializer/de-serializer having a second serial data receive port and a second serial data transmit port plugged into the backplane;
a second logic section connected to parallel data ports of the second serializer/de-serializer;
wherein the second serializer/de-serializer is placed in a loop-back mode in response to a loop-back signal fed to the second serializer/de-serializer to pass data fed to the second serial data receive port thereof to the second serial data transmit port thereof;
wherein the backplane connects the first serial data transmit port to the second serial data receive port;
a tester for feeding serial data into the first serial data receive port;
wherein the data passes from the first serial receive data port to the first serial data transmit port when such first serializer/de-serializers is placed in the loop-back mode;
wherein the data passes from the first serial transmit port through the backplane into the second serial data receive port;
wherein the data passes from the second serial receive data port to the second transmit serial data port when the second serializer/de-serializers is placed in the loop-back mode;
wherein the data passes from the second serial data transmit port to the tester; and wherein the first serializer/de-serializer and the first logic section are on one integrated circuit chip and the second serializer/de-serializer and the second logic section are on different integrated circuit chip.

8. The system recited in claim 7 wherein the first serializer/de-serializer and the second serializer/de-serializer are manufactured by different vendors.

9. The system recited in claim 7 wherein the tester is a bit error rate tester.

10. A method for testing a serializer/de-serializer system having: a first serializer/de-serializer having a first serial data receive port and a first serial data transmit port, the serializer/de-serializer being placed in a loop-back mode in response to a loop-back signal fed to the serializer/de-serializer to pass data fed to the first serial data receive port to the first serial data transmit port; a second serializer/de-serializer having a second serial data receive port and second serial data transmit port, second serializer/de-serializer being placed in a loop-back mode in response to a loop-back signal fed to the second serializer/de-serializer to pass data fed to the second serial data receive port to the second serial data transmit port; and a backplane for connecting the first serial data transmit port to the second serial data receive port the method comprising:
passing a known pattern of serial data to the first serial data receive port;
wherein the data passes from the first serial receive data port to the first serial data transmit port with the first serializer/de-serializer placed in the loop-back mode;
wherein the data passes from the first serial transmit port through the backplane into the second serial data receive port of the second serializer/de-serializer;
wherein the data passes from the second serial receive data port to the second transmit serial data port with the second serializer/de-serializer placed in the loop-back mode;
comparing the data passing to the from the second serial data transmit port with the known pattern of serial data passed to the first serial data receive port; and
wherein the first serializer/de-serializer and the second serializer/de-serializer are on different integrated circuit chips.

11. The method recited in claim 10 wherein the first serializer/de-serializer and the second serializer/de-serializer are manufactured by different vendors.

12. The method recited in claim 11 wherein the tester test a bit error rate tester of the data compared therein.

13. The method recited in claim 10 wherein the tester is a bit error rate tester.

14. The method recited in claim 10 including feeding first reference clock signals for the first serializer/de-serializer and second reference clock signals for the first serializer/de-serializer, the first reference clock signals having a frequency different from the second reference clock signals.

15. The method recited in claim 14 wherein the tester is bit error rate tester and wherein a signal generator produces one of the first and second clock reference signals and a phase locked signal for the bit error rate tester and wherein the bit error rate tester produces the other one of the first and second clock reference signal.

* * * * *